(12) United States Patent
Sakurada et al.

(10) Patent No.: US 9,183,083 B2
(45) Date of Patent: Nov. 10, 2015

(54) CONTROLLER

(71) Applicant: Kabushiki Kaisha Toshiba, Minato-ku (JP)

(72) Inventors: Kenji Sakurada, Yamato (JP); Hironori Uchikawa, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 143 days.

(21) Appl. No.: 13/946,449

(22) Filed: Jul. 19, 2013

(65) Prior Publication Data

US 2014/0223263 A1 Aug. 7, 2014

Related U.S. Application Data

(60) Provisional application No. 61/761,396, filed on Feb. 6, 2013.

(51) Int. Cl.

| | |
|---|---|
| *G11C 29/00* | (2006.01) |
| *G06F 11/10* | (2006.01) |
| *H04L 1/00* | (2006.01) |
| *H03M 13/29* | (2006.01) |
| *H03M 13/11* | (2006.01) |
| *H03M 13/45* | (2006.01) |

(Continued)

(52) U.S. Cl.
CPC ........ *G06F 11/1048* (2013.01); *G06F 11/1008* (2013.01); *G06F 11/1044* (2013.01); *G06F 11/1068* (2013.01); *G06F 11/1076* (2013.01); *G11C 7/1006* (2013.01); *H03M 13/11* (2013.01); *H03M 13/2957* (2013.01); *H03M 13/3927* (2013.01); *H03M 13/45* (2013.01); *H04L 1/0041* (2013.01); *H04L 1/0057* (2013.01); *H04L 1/0061* (2013.01); *H04L 1/0072* (2013.01)

(58) Field of Classification Search
CPC ............ G06F 11/1008; G06F 11/1076; G06F 11/1068; G06F 11/1044; G11C 7/1006; H04L 1/0057; H04L 1/0061; H04L 1/0041; H04L 1/0083; H04L 1/0072; H04L 1/0045; H04L 1/005; H03M 13/11; H03M 13/45; H03M 13/2957; H03M 13/3927
USPC ......... 714/752, 763, 776, 780, 782, 786, 785, 714/794, 759
See application file for complete search history.

(56) References Cited

U.S. PATENT DOCUMENTS

| | | | | |
|---|---|---|---|---|
| 6,043,946 | A | * | 3/2000 | Genheimer et al. ............ 360/53 |
| 7,203,887 | B2 | * | 4/2007 | Eroz et al. ...................... 714/758 |
| 7,904,783 | B2 | * | 3/2011 | Brandman et al. ............. 714/755 |

(Continued)

OTHER PUBLICATIONS

U.S. Appl. No. 14/206,315, filed Mar. 2014, Ogawa, Masaru.*

(Continued)

*Primary Examiner* — Albert Decady
*Assistant Examiner* — Osman Alshack
(74) *Attorney, Agent, or Firm* — Oblon, McClelland, Maier & Neustadt, L.L.P.

(57) ABSTRACT

According to one embodiment, a controller includes a generator and a creator. The generator generates a channel matrix by counting a number of times a combination of a correct bit value and a read level appears for each bit forming a decoded first frame, based on readout data indicating a read level of each of a plurality of bits forming a frame and the decoded frame. The creator creates a table by statistically calculating a likelihood of a correct bit value of each read level based on the channel matrix.

11 Claims, 6 Drawing Sheets

(51) Int. Cl.
    *H03M 13/39*    (2006.01)
    *G11C 7/10*     (2006.01)

(56) References Cited

U.S. PATENT DOCUMENTS

| | | | |
|---|---|---|---|
| 7,966,550 B2* | 6/2011 | Mokhlesi et al. | 714/780 |
| 8,028,214 B2* | 9/2011 | Sugitani et al. | 714/752 |
| 8,301,979 B2* | 10/2012 | Sharon et al. | 714/763 |
| 8,429,501 B2* | 4/2013 | Tseng et al. | 714/773 |
| 8,464,129 B2* | 6/2013 | Gunnam | 714/759 |
| 2011/0083060 A1* | 4/2011 | Sakurada et al. | 714/763 |

OTHER PUBLICATIONS

U.S. Appl. No. 14/206,315, filed Mar. 12, 2014, Ogawa, et al.
Office Action mailed Jul. 17, 2015 in Taiwanese Application No. 102115297 (w/English translation).

* cited by examiner

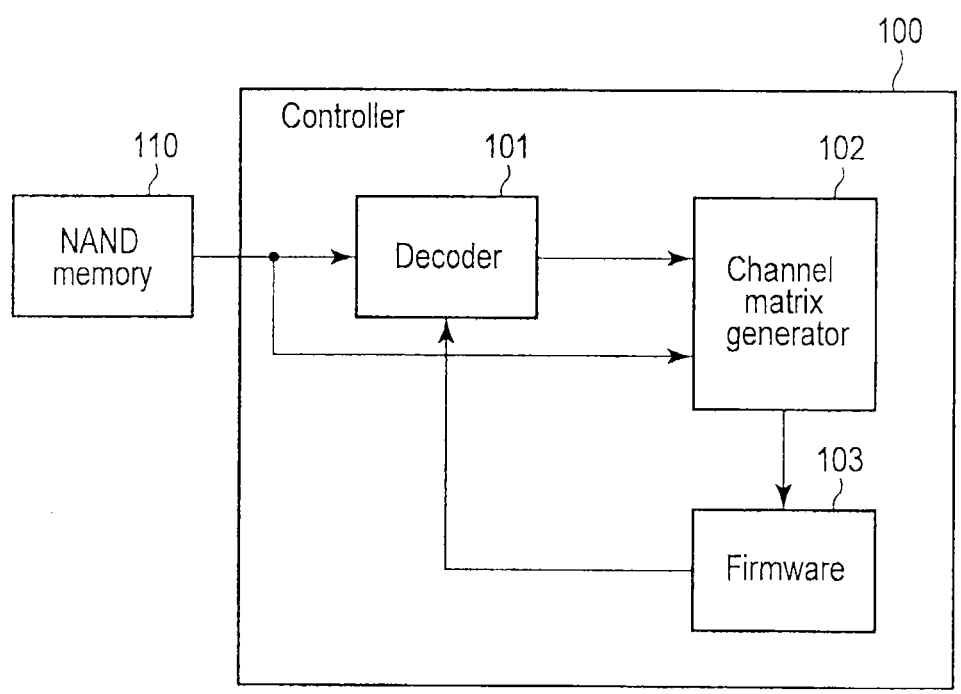
F I G. 1

| | Er | | | A | | | B | | | C | | | D | | | E | | | F | | | G |
|---|---|---|---|---|---|---|---|---|---|---|---|---|---|---|---|---|---|---|---|---|---|---|
| Lower | 1 | 1 | 1 | 0 | 0 | 0 | 0 | 0 | 0 | 0 | 0 | 0 | 1 | 1 | 1 | 1 | 1 | 1 | 1 | 1 | 1 | 1 |
| ENOR (SB1) | 1 | 1 | 0 | 0 | 0 | 1 | 1 | 1 | 1 | 1 | 1 | 1 | 0 | 0 | 1 | 1 | 1 | 1 | 1 | 1 | 1 | 1 |
| ENOR3 (SB2) | 1 | 0 | 0 | 0 | 1 | 1 | 1 | 1 | 1 | 1 | 1 | 1 | 0 | 0 | 1 | 0 | 0 | 1 | 1 | 1 | 1 | 0 |
| Cread (SB3) | 1 | 1 | 1 | 1 | 1 | 1 | 1 | 1 | 1 | 0 | 0 | 0 | 0 | 0 | 0 | 0 | 7 | 7 | 7 | 7 | 7 | 0 |
| Index | 15 | 11 | 9 | 13 | 12 | 8 | 10 | 14 | 14 | 14 | 14 | 6 | 6 | 6 | 6 | 6 | 2 | 0 | 4 | 5 | 1 | 3 | 7 | 7 | 7 | 7 | 7 | 7 |

FIG. 2

| | 1111 | 1011 | 1001 | 1101 | 1100 | 1000 | 1010 | 1110 |
|---|---|---|---|---|---|---|---|---|
| 0 | 271411 | 41298 | 31484 | 40406 | 150049 | 459742 | 761546 | 23104878 |
| 1 | 12251722 | 4184 | 2189 | 3161 | 7164 | 11397 | 9456 | 16104 |

| | 0110 | 0010 | 0000 | 0100 | 0101 | 0001 | 0011 | 0111 |
|---|---|---|---|---|---|---|---|---|
| 0 | 21731356 | 1224247 | 904958 | 398098 | 223070 | 76170 | 36481 | 20366 |
| 1 | 48376 | 46979 | 113164 | 178937 | 397878 | 522847 | 1091913 | 34791129 |

FIG. 3

| | 0 | 1 | 2 | 3 | 4 | 5 | 6 | 7 |
|---|---|---|---|---|---|---|---|---|
| 0 | [0][0] | [0][1] | [0][2] | [0][3] | [0][4] | [0][5] | [0][6] | [0][7] |
| 1 | [1][0] | [1][1] | [1][2] | [1][3] | [1][4] | [1][5] | [1][6] | [1][7] |

| | 8 | 9 | 10 | 11 | 12 | 13 | 14 | 15 |
|---|---|---|---|---|---|---|---|---|
| 0 | [0][8] | [0][9] | [0][10] | [0][11] | [0][12] | [0][13] | [0][14] | [0][15] |
| 1 | [1][8] | [1][9] | [1][10] | [1][11] | [1][12] | [1][13] | [1][14] | [1][15] |

FIG. 4

| | Block A | Block B | | | | Block C | Block D |
|---|---|---|---|---|---|---|---|
| wordline 0 | | Frame 0 | Frame 1 | Frame 2 | Frame 3 | | |
| wordline 1 | | Frame 0 | Frame 1 | Frame 2 | Frame 3 | | |
| wordline 2 | | Frame 0 | Frame 1 | Frame 2 | Frame 3 | | |
| ⋮ | | | | | | | |
| wordline 85 | | Frame 0 | Frame 1 | Frame 2 | Frame 3 | | |

CONTROLLER

CROSS-REFERENCE TO RELATED APPLICATIONS

This application claims the benefit of U.S. Provisional Application No. 61/761,396, filed Feb. 6, 2013, the entire contents of which are incorporated herein by reference.

FIELD

Embodiments described herein relate generally to a controller of a nonvolatile semiconductor memory.

BACKGROUND

Data read out from a nonvolatile semiconductor memory is normally converted into an LLR (Log-Likelihood Ratio) in accordance with a pre-created table called an LLR table, and undergoes error correction. The likelihood of write data (i.e., a correct bit value) with respect to readout data changes in accordance with stress on a storage area of the readout data.

Even when a plurality of LLR tables optimized for a plurality of typical stresses (e.g., PD (Program Disturb), DR (Data Retention), and RD (Read Disturb) are pre-created, it is difficult to adapt the tables to all of various stresses that can be applied to memory cells of a nonvolatile semiconductor memory. That is, even when a plurality of LLR tables are pre-created, it may be impossible to suppress deterioration of the error correctability under a given unexpected stress (e.g., a composite stress of the DR stress and RD stress).

BRIEF DESCRIPTION OF THE DRAWINGS

FIG. 1 is a block diagram showing an example of a controller according to the first embodiment;

FIG. 2 is a view showing an example of readout data of Lower page from a nonvolatile semiconductor memory;

FIG. 3 is a table showing an example of a chancel matrix of Lower page;

FIG. 4 is a table showing an example of a two-dimensional array for referring to elements of the channel matrix shown in FIG. 3;

DETAILED DESCRIPTION

Figures 5, 6:
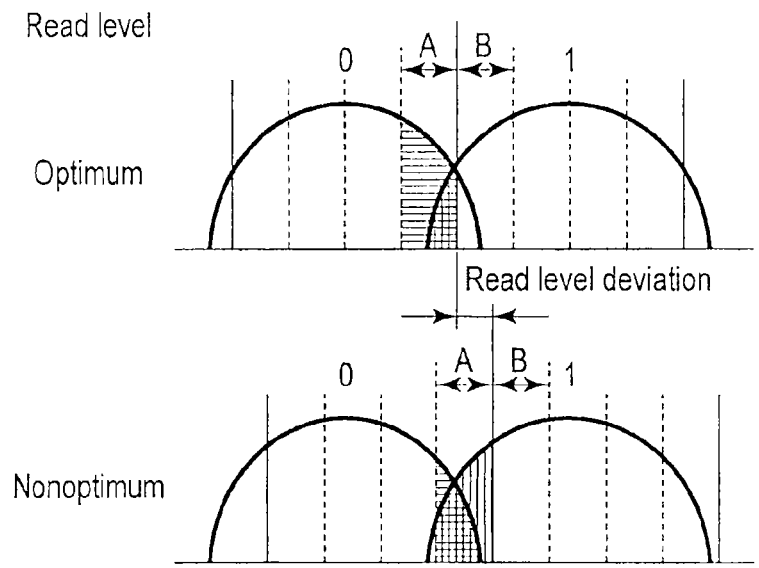
FIG. 5 is a view for explaining an influence on an LLR caused by a failure of Vth tracking.
FIG. 6 is a view for explaining an LDPC (Low Density Parity Check) frame to be preferentially decoded when executing DLE (Dynamic LLR Estimation)

Embodiments will be explained below with reference to the accompanying drawings. Note that in the following description, elements identical to or similar to already explained elements are denoted by identical or similar reference numerals, and a repetitive explanation will basically be omitted.

In general, according to one embodiment, a controller includes a decoder, a generator and a creator. The decoder inputs, from a nonvolatile semiconductor memory, first readout data indicating a read level of each of a plurality of bits forming a first frame, converts the first readout data into first likelihood information in accordance with a first table, and decodes the first frame by using the first likelihood information to obtain a decoded first frame. The generator generates a channel matrix by counting a number of times a combination of a correct bit value and a read level appears for each bit forming the decoded first frame, based on the first readout data and the decoded first frame. The creator creates a second table by statistically calculating a likelihood of a correct bit value of each read level based on the channel matrix.

First Embodiment

As shown in FIG. 1, a controller 100 according to the first embodiment includes a decoder 101, channel matrix generator 102, and firmware 103. The controller 100 reads out data stored in a NAND memory 110, and corrects an error contained in the readout data. Note that the controller 100 may also have, e.g., a function of performing error correction encoding on data, and a function of writing the error-correction-coded data (i.e., an ECC (Error Correction Code) frame) in the NAND memory 110.

The decoder 101 inputs readout data for each ECC frame from the NAND memory 110. The readout data contains not only a hard-decision bit value for each of a plurality of bits forming the ECC frame, but also a plurality of (e.g., three) soft-decision bit values for each of the plurality of bits. In other words, the readout data indicates the read level of each of the plurality of bits forming the ECC frame. In the following explanation, it is assumed that the ECC frame is an LDPC frame. Furthermore, the ECC frame may also be separated into a plurality of chips (a plurality of channel matrices). Note that the decoder 101 can also input the readout data via a NAND interface.

In a so-called 2-3-2 code type as shown in FIG. 2, a lower page (i.e., the least significant bit stored in a memory cell) is read out by using two threshold voltages. More specifically, assume that eight levels of Er, A, B, C, D, E, F, and G are allocated in ascending order to a write voltage. When a write bit value is "XY1" (X and Y each mean "0" or "1"), the write voltage exists on Er or one of E to G. When a write bit value is "XY0", the write voltage exists on one of A to D.

Accordingly, the lower page can be read out by using a threshold voltage $V_A$ in the boundary between Er and A, and a threshold voltage $V_E$ in the boundary between D and E. The readout result obtained by using the threshold voltage $V_A$ is called ARead, and the readout result obtained by using the threshold voltage $V_E$ is called ERead. The hard-decision bit (HBRead) of the lower page is obtained by performing an ENOR operation on the Aread and Eread (see "Lower" in FIG. 2).

Also, one of the soft-decision bits of the lower page is obtained by performing an ENOR operation on the readout result obtained by using a threshold voltage $V_{A+2\Delta R}$ higher by two steps than the threshold voltage $V_A$ and a threshold voltage $V_{A-2\Delta R}$ lower by two steps than that, and on the readout result obtained by using a threshold voltage $V_{E+2\Delta R}$ higher by two steps than the threshold voltage $V_E$ and a threshold voltage $V_{E-2\Delta R}$ lower by two steps than that (see "ENOR (SB1)" in FIG. 2).

Furthermore, one of the soft-decision bits of the lower page is obtained by performing an ENOR operation on the readout result obtained by using a threshold voltage $V_{A+3\Delta R}$ higher by three steps than the threshold voltage $V_A$ and a threshold voltage $V_{A-3\Delta R}$ lower by three steps than that, and a threshold voltage $V_{A+\Delta R}$ higher by one step than the threshold voltage $V_A$ and a threshold voltage $V_{A-\Delta R}$ lower by one step than that, and on the readout result obtained by using a threshold voltage $V_{E+3\Delta R}$ higher by three steps than the threshold voltage $V_E$ and a threshold voltage $V_{E-3\Delta R}$ lower by three steps than that, and a threshold voltage $V_{E+\Delta R}$ higher by one step than the threshold voltage $V_E$ and a threshold voltage $V_{E-\Delta R}$ lower by one step than that (see "ENOR3 (SB2)" in FIG. 2). The readout result obtained by using a threshold voltage $V_C$ in the boundary between C and D is also one of the soft-decision bits of the lower page (see "CRead (SB3)" in FIG. 2.

The four bits "CRead (SB3)", "ENOR3 (SB2)", "ENOR (SB1)", and "Lower" are used as an index (see "index" in FIG. 2) indicating a corresponding read level (RD). For example, an index "15" (=1111) indicates the lowest read level "0" (i.e., $V_{A-3\Delta R}$ or less). On the other hand, an index "7" (=0111) indicates the highest read level "15" (i.e., $V_{E+3\Delta R}$ or more).

The decoder 101 converts the readout data into likelihood information in accordance with a table set by the firmware 103. In the following explanation, it is assumed that the likelihood information is an LLR, and the table is an LLR table (i.e., a table for associating readout data with an LLR).

The decoder 101 iteratively performs decoding by using the LLR. If an LDPC frame is successfully decoded, the decoder 101 can output the decoded LDPC frame to, e.g., a data processor (not shown). Also, when executing DLE, the decoder 101 outputs a successfully decoded LDPC frame to the channel matrix generator 102.

When executing DLE, the channel matrix generator 102 inputs one or more successfully decoded LDPC frames from the decoder 101, and inputs readout data corresponding to the LDPC frames from the NAND) memory 110 (or via a NAND interface (not shown)).

When executing DLE, the channel matrix generator 102 detects a correct bit value and read level (or the above-described index) for each bit forming the input LDPC frame. The correct bit value can be detected by referring to the bit value of the decoded LDPC frame. The channel matrix generator 102 generates a channel matrix by counting the number of times a combination of the correct bit value and read level appears. The channel matrix generator 102 outputs the channel matrix to the firmware 103.

More specifically, the channel matrix generator 102 can generate a channel matrix shown in FIG. 3 for a 2-3-2 code type lower page. The size of the matrix shown in FIG. 3 is 2 rows×16 columns. Each row represents a correct bit value, and each column represents an index corresponding to a read level. For example, when the correct bit value of a given bit in an input LDPC frame is "1" and the index of a read level is "1111", the channel matrix generator 102 counts up an element in the first row and first column of the channel matrix by 1.

When executing DLE, the firmware 103 inputs the channel matrix from the channel matrix generator 102. The firmware 103 creates an LLR table based on the channel matrix. The firmware 103 sets the created LLR table in the decoder 101 as needed. Note that the firmware 103 can also be called a table creator 103. Furthermore, the table creator 103 can be implemented as hardware instead of firmware.

More specifically, the firmware 103 creates an LLR table by statistically calculating the likelihood (i.e., the LLR) of the correct bit value of each read level based on the channel matrix. For example, when explaining the elements of the channel matrix shown in FIG. 3 by referring to a two-dimensional array shown in FIG. 4, the firmware 103 can statistically calculate the LLR of the correct bit value of each read level (RD=0, . . . , 15) by using equation (1) below.

$$LLR[RD] = \operatorname{Ln}\left[\frac{\frac{[0][RD]}{\sum_{J=0}^{15}[0][J]}}{\frac{[1][RD]}{\sum_{J=0}^{15}[1][J]}}\right] \quad (1)$$

Note that the firmware 103 need not strictly calculate equation (1). For example, Ln[0] and Ln[∞] cannot numerically be calculated. If "0" exists as an element in the matrix, therefore, the firmware 103 can calculate equation (1) by replacing this element with a natural number having a small absolute value, e.g., "1". Also, if the absolute value of the LLR[RD] is very large, the firmware 103 can perform, e.g., scaling or clipping as needed. For example, the firmware 103 can round the LLR[RD] within the range of values that can be allowed by the system configuration or circuit configuration.

In addition, LLR=0 is theoretically possible as a calculation result, but the decoder 101 may cause an operation error if LLR=0 occurs too often. If LLR[RD]=0 is calculated by equation (1), therefore, the firmware 103 can create an LLR table by replacing the LLR[RD] with an integer having a small absolute value, e.g., "1" or "−1". For example, if 0≤LLR[RD]<1, the firmware 103 can round this LLR[RD] to 1. If −1<LLR[RD]<0, the firmware 103 can round this LLR[RD] to −1.

The controller 100 typically executes DLE as needed when decoding of an LDPC frame has failed. Since the correct bit value of an unsuccessfully decoded LDPC frame is unknown, no LLR can be created based on this LDPC frame. However, it is highly likely that a stress on a given memory cell is similar to a stress on another geographically close memory cell. That is, the Vth distribution of a given memory cell can be approximated to that of another geographically close memory cell. Accordingly, the decoder 101 preferably preferentially decodes an LDPC frame stored in an area geographically close to an unsuccessfully decoded LDPC frame.

Assume that decoding of Frame 1 (this frame is called an LDPC frame of interest) of wordline 1 in Block B shown in FIG. 6 has failed. In this case, the decoder 101 can decode Frame 0, Frame 2, or Frame 3 of wordline 1 in Block B (i.e., another LDPC frame stored in the same page as that of the LDPC frame of interest) in preference to LDPC frames stored in different pages.

The decoder 101 can also decode another arbitrary frame in Block B (i.e., another LDPC frame stored in the same block as that of the LDPC frame of interest), and another arbitrary frame of wordline 1 (i.e., another LDPC frame stored in the same wordline as that of the LDPC frame of interest), in preference to LDPC frames stored in different blocks and different wordlines.

Furthermore, the decoder 101 can decode another LDPC frame stored in the same plane as that of the LDPC frame of interest in preference to LDPC frames stored in different planes. Note that if an area subjected to a stress similar to that on the LDPC frame of interest can be derived from an element other than the geographical condition, the decoder 101 can preferentially decode another LDPC frame stored in the area regardless of the geographical condition of the area.

Figure 7:
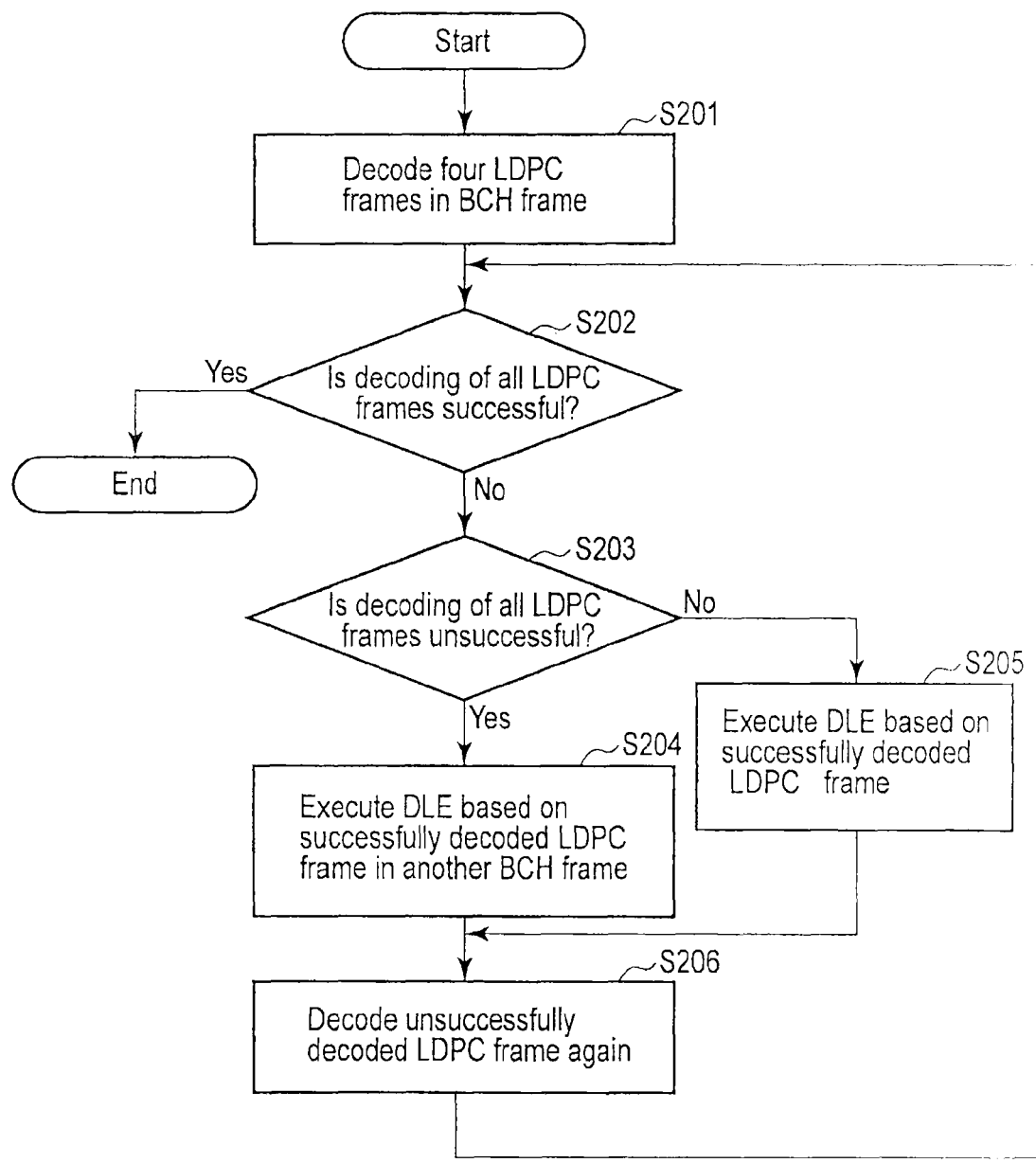
FIG. 7 is a flowchart showing an example of an LDPC frame decoding operation performed by the controller shown in FIG. 1.

The controller 100 executes DLE as needed during a decoding operation shown in, e.g., FIG. 7. This decoding operation shown in FIG. 7 decodes a total of four LDPC frames forming one arbitrary BCH frame.

First, the decoder 101 iteratively decodes each of four LDPC frames forming a target BCH frame (stop S201). More specifically, the decoder 101 inputs readout data corresponding to each of the four LDPC frames, converts the readout data into an LLR in accordance with an LLR table set by the firmware 103, and iteratively performs decoding by using the LLR. After step S201, the process advances to step S202.

If it is determined in step S202 that the decoder 101 has succeeded in decoding all the LDPC frames, the process is terminated. On the other hand, if it is determined in step S202 that the decoder 101 has failed in decoding at least one LDPC frame, the process advances to step S203.

If it is determined in step S203 that the decoder 101 has failed in decoding all the LDPC frames, the process advances to step S204. On the other hand, if it is determined in step S203 that the decoder 101 has succeeded in decoding at least one LDPC frame, the process advances to step S205.

In step S204, the controller 100 executes DLE. Since, however, decoding of all the LDPC frames forming the target BCH frame has failed, it is necessary to create an LLR table based on one or more LDPC frames forming another BCH frame. Therefore, the decoder 101 decodes one or more LDPC frames forming another BCH frame. The channel matrix generator 102 generates a channel matrix by counting the number of times a combination of a correct bit value and read level appears, for each bit of one or more successfully decoded LDPC frames. The firmware 103 creates an LLR table by statistically calculating the LLR of the correct bit value of each read level based on the channel matrix. After step S204, the process advances to step S206.

The controller 100 executes DLE in stop S205 as well. However, one or more LDPC frames have successfully been decoded unlike in step S204, so an LLR table can be created based on the LDPC frames. It is also possible to perform a step identical to or similar to above-described step S204, instead of step S205. Either way, the channel matrix generator 102 generates a channel matrix by counting the number of times a combination of a correct bit value and read level appears, for each bit of the one or more successfully decoded LDPC frames. The firmware 103 creates an LLR table by statistically calculating the LLR of the correct bit value of each read level based on the channel matrix. After step S205, the process advances to step S206.

In step S206, the decoder 101 decodes the unsuccessfully decoded LDPC frame (the LDPC frame of interest) again, in accordance with the LLR created by DLE executed in step S204 or S205. After step S206, the process returns to step S202.

Note that if step S204 or S205 is executed a plurality of times, it is also possible to create an LLR table based on an LDPC frame different from the LDPC frame referred to in the past.

In this operation example shown in FIG. 7, DLE is executed when an LDPC frame is unsuccessfully decoded. However, it is also possible to additionally execute DLE under a specific condition in order to prevent unsuccessful decoding of an LDPC frame.

Figure 8:
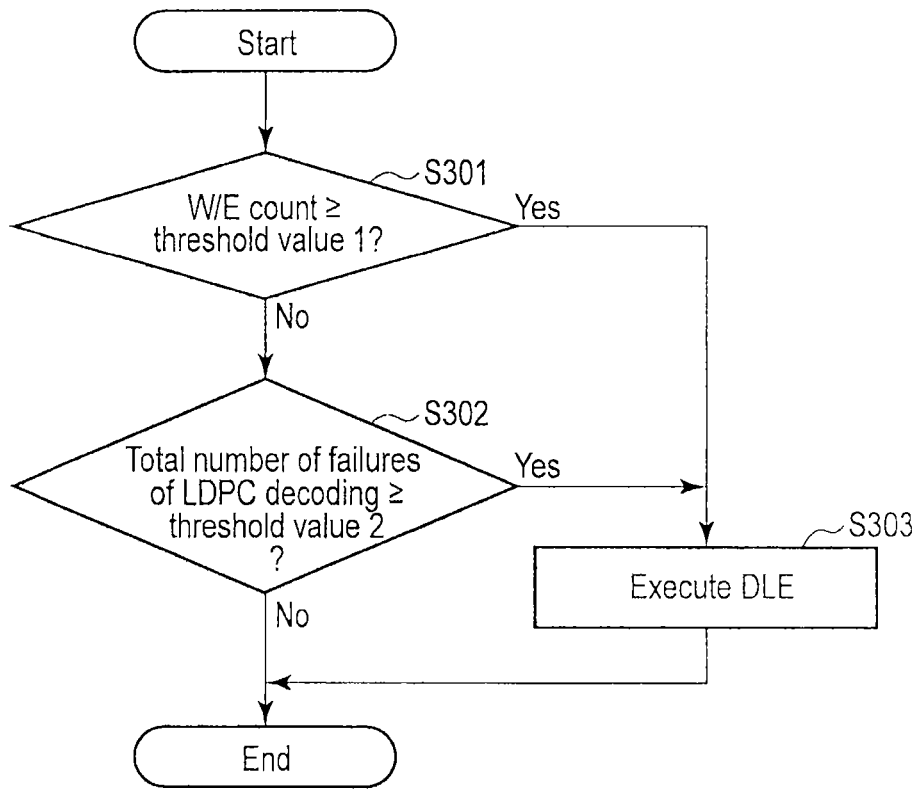
FIG. 8 is a flowchart showing examples of conditions under which the controller shown in FIG. 1 executes additional DLE.

For example, as shown in FIG. 8, DLE can be executed (step S303) if a W/E count has reached a threshold value 1 (step S301), or if the total number of failures of LDPC decoding has reached a threshold value 2 (step S302). Note that the total number of failures of LDPC decoding in step S302 is incremented when LDPC decoding is unsuccessful but BCH decoding is successful (i.e., when no DLE is executed in the operation example shown in FIG. 7).

Furthermore, DLE can be executed when, e.g., the number of trials of iterative decoding has reached a threshold value, or Vth tracking is performed. "Vth tracking" herein mentioned means a process of adjusting the threshold voltage to aim at a boundary value at which adjacent Vth distributions intersect each other, in order to minimize an error contained in readout data from a memory cell having a largely shifted Vth distribution (e.g., a memory cell strongly subjected to DR stress). When Vth tracking is performed, the threshold voltage for use in read shifts. Ideally, the threshold voltage is set to a boundary value (i.e., an optimum value) at which adjacent Vth distributions intersect each other as shown in FIG. 5. A pre-created LLR table is generally based on the premise that an almost optimum threshold voltage is set under a given stress. If Vth tracking is successful, therefore, an LLR close to an actual value can be derived through the LLR table.

On the other hand, if Vth tracking is unsuccessful, the threshold voltage is set to deviate from the boundary value. For example, if the threshold voltage is set to deviate from the boundary value to the high-voltage side, an LLR corresponding to read level A shown in FIG. 5 must have a negative value (the probability that correct bit value=1 is higher than the probability that correct bit value=0). In the example shown in FIG. 5, however, the optimized LLR table converts read level A into a positive LLR (the probability that correct bit value=0 is higher than the probability that correct bit value=1). That is, if Vth tracking fails, the sign of an LLR corresponding to a read level near the boundary value readily inverts with respect to an actual value.

Accordingly, it is possible, by executing DLE when Vth tracking is performed, to create an LLR table that converts a read level into an LLR close to an actual value regardless of whether Vth tracking is successful or unsuccessful. That is, it is possible to suppress deterioration of the error correctability of the decoder 101, which is caused by a failure of Vth tracking.

As explained above, when DLE is executed, the controller according to the first embodiment generates a channel matrix and statistically calculates the LLR of the correct bit value of each read level based on the channel matrix, thereby creating an LLR table. This controller generates a channel matrix by preferentially referring to a successfully decoded LDPC frame stored in an area highly likely to be subjected to stress similar to that on an LDPC frame of interest. Accordingly, this controller can dynamically create an LLR table adapted to the stress applied to the storage area of the LDPC frame of interest. That is, this controller can stably convert readout data into appropriate likelihood information and correct an error regardless of the stress applied to the storage area of the LDPC frame of interest.

Note that in this embodiment, a successfully decoded LDPC frame is referred to in order to generate a channel matrix. However, it is conditionally also possible to refer to an unsuccessfully decoded LDPC frame. More specifically, if the number of NG syndromes for a given LDPC frame is equal to or smaller than a threshold value (e.g., 10) at the end of decoding, a channel matrix may be generated by referring to this LDPC frame. This threshold value can be determined based on a local structure (trapping set) included in a parity check matrix for use in iterative decoding of LDPC frames.

Second Embodiment

A controller according to the second embodiment differs from the controller according to the above-described first embodiment in the operation concerning the DLE. More specifically, when executing DLE, the controller according to the first embodiment generates a channel matrix based on one or more successfully decoded LDPC frames. The controller according to this embodiment requires no decoding when executing DLE. More specifically, the controller according to this embodiment generates a channel matrix based on one or more LDPC frames (to be referred to as known LDPC frames hereinafter) corresponding to known data.

As shown in FIG. 1, a controller 100 according to the second embodiment includes a decoder 101, channel matrix generator 102, and firmware 103. The controller 100 reads out data stored in a NAND memory 110, and corrects an error contained in the readout data.

When executing DLE, the channel matrix generator 102 inputs readout data corresponding to one or more known LDPC frames from the NAND memory 110 (or via a NAND interface (not shown)).

Note that the known LDPC frames can be written in a partial storage area of the NAND memory 110 before or after DLE is started. The known LDPC frame storage area is preferably subjected to a stress similar to that on a storage area for an LDPC frame of interest.

When executing DLE, the channel matrix generator 102 detects a correct bit value and read level for each bit forming the known LDPC frame. The correct bit value can be detected by referring to the bit value of the known LDPC frame. The channel matrix generator 102 generates a channel matrix by counting the number of times a combination of the correct bit value and read level appears. The channel matrix generator 102 outputs the channel matrix to the firmware 103.

Note that page data corresponding to known data may also be used instead of the known LDPC frame. Note also that the number of known LDPC frames to be read out when executing DLE can be matched with the read unit of the NAND memory 110. Furthermore, an LLR table created based on the known LDPC frame can be applied for each page, each block, or each plane.

As explained above, when executing DLE, the controller according to the second embodiment generates a channel matrix and statistically calculates the LLR of the correct bit value of each read level based on the channel matrix, thereby creating an LLR table. This controller generates a channel matrix by preferentially referring to a known LDPC frame stored in an area highly likely to be subjected to a stress similar to that on an LDPC frame of interest. Accordingly, this controller can achieve effects identical to or similar to those of the first embodiment without requiring any decoding of an LDPC frame except for an LDPC frame of interest.

The processing of each embodiment described above can be implemented by using a general-purpose computer as basic hardware. A program for implementing the processing of each embodiment can be provided by storing the program in a computer-readable storage medium. The program is stored in the storage medium as a file having an installable form or a file having an executable form. Examples of the storage medium are a magnetic disk, an optical disc (e.g., a CD-ROM, CD-R, or DVD), a magnetooptical disc (e.g., an MO), and a semiconductor memory. The storage medium can be any medium as long as the medium can store the program and can be read by a computer. The program for implementing the processing of each embodiment can also be stored on a computer (server) connected to a network such as the Internet, and downloaded to a computer (client) across the network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller comprising:
   a decoder configured to input, from a nonvolatile semiconductor memory, first readout data indicating a read voltage level of each of a plurality of bits forming a first frame, convert the first readout data into first likelihood information in accordance with a first table, and decode the first frame by using the first likelihood information to obtain a decoded first frame;
   a generator configured to generate a channel matrix by counting a number of times of a combination of a correct bit value and a read voltage level in the decoded first frame, based on the first readout data and the decoded first frame; and
   a creator configured to create a second table by statistically calculating a likelihood of a correct bit value of each read voltage level based on the channel matrix.

2. The controller according to claim 1, wherein the decoder inputs, from the nonvolatile semiconductor memory, second readout data indicating a read voltage level of each of a plurality of bits forming a second frame different from the first frame, converts the second readout data into second likelihood information in accordance with the second table, and decodes the second frame by using the second likelihood information to obtain a decoded second frame.

3. The controller according to claim 2, wherein the first frame is stored in a same page as that of the second frame.

4. The controller according to claim 2, wherein the first frame is stored in a same block as that of the second frame.

5. The controller according to claim 2, wherein the first frame is stored in a same wordline as that of the second frame.

6. The controller according to claim 1, wherein if the decoder fails in decoding a second frame different from the first frame, the decoder inputs the first readout data from the nonvolatile semiconductor memory, converts the first readout data into the first likelihood information in accordance with the first table, and decodes the first frame by using the first likelihood information to obtain the decoded first frame.

7. The controller according to claim 1, wherein when a Write/Erase count in a storage area of a second frame different from the first frame reaches a threshold value, the decoder inputs the first readout data from the nonvolatile semiconductor memory, converts the first readout data into the first likelihood information in accordance with the first table, and decodes the first frame by using the first likelihood information to obtain the decoded first frame.

8. The controller according to claim 1, wherein when Vth (threshold voltage) tracking is performed on a storage area of a second frame different from the first frame, the decoder inputs the first readout data from the nonvolatile semiconductor memory, converts the first readout data into the first likelihood information in accordance with the first table, and decodes the first frame by using the first likelihood information to obtain the decoded first frame.

9. The controller according to claim 1, wherein the creator is implemented as firmware.

10. A controller comprising:
    a generator configured to input, from a nonvolatile semiconductor memory, first readout data indicating a read voltage level of each of a plurality of bits forming a first frame whose correct bit values are capable of being referred to without decoding, and generate a channel matrix by counting a number of times of a combination of a correct bit value and a read voltage level in the first frame, based on the first readout data and the first frame; and a creator configured to create a first table by statistically calculating a likelihood of a correct bit value of each read voltage level based on the channel matrix.

11. The controller according to claim 10, further comprising a decoder configured to input, from the nonvolatile semiconductor memory, second readout data indicating a read voltage level of each of a plurality of bits forming a second frame different from the first frame, convert the second readout data into first likelihood information in accordance with the first table, and decode the second frame by using the first likelihood information to obtain a decoded second frame.

* * * * *